(12) United States Patent
Motamed

(10) Patent No.: US 8,031,100 B2
(45) Date of Patent: Oct. 4, 2011

(54) FINE RESISTANCE ADJUSTMENT FOR POLYSILICON

(75) Inventor: Ali Motamed, San Francisco, CA (US)

(73) Assignee: Intersil Americas Inc., Milpitas, CA (US)

( * ) Notice: Subject to any disclaimer, the term of this patent is extended or adjusted under 35 U.S.C. 154(b) by 14 days.

(21) Appl. No.: 12/765,615

(22) Filed: Apr. 22, 2010

(65) Prior Publication Data

US 2011/0102227 A1 May 5, 2011

Related U.S. Application Data

(60) Provisional application No. 61/172,318, filed on Apr. 24, 2009.

(51) Int. Cl.
H03M 1/78 (2006.01)

(52) U.S. Cl. .......................... 341/154; 341/144; 341/145

(58) Field of Classification Search .................. 341/145, 341/154
See application file for complete search history.

(56) References Cited

U.S. PATENT DOCUMENTS

| | | | |
|---|---|---|---|
| 4,164,668 A | 8/1979 | Delaporte et al. | |
| 4,210,996 A * | 7/1980 | Amemiya et al. | 29/610.1 |
| 4,311,988 A | 1/1982 | Kelley et al. | |
| 4,868,482 A | 9/1989 | O'Shaughnessy et al. | |
| 5,108,945 A | 4/1992 | Matthews | |
| 5,329,155 A | 7/1994 | Lao et al. | |
| 5,534,862 A | 7/1996 | Gross, Jr. et al. | |
| 5,554,986 A * | 9/1996 | Neidorff | 341/145 |
| 5,589,847 A | 12/1996 | Lewis | |
| 5,751,050 A | 5/1998 | Ishikawa et al. | |
| 6,529,152 B1 | 3/2003 | Piasecki et al. | |
| 7,112,535 B2 | 9/2006 | Coolbaugh et al. | |
| 7,119,656 B2 | 10/2006 | Landsberger et al. | |
| 7,461,285 B2 | 12/2008 | Nervegna | |
| 7,616,089 B2 | 11/2009 | Yang et al. | |
| 2002/0186158 A1 | 12/2002 | Leung | |
| 2009/0002120 A1 | 1/2009 | Molin et al. | |
| 2009/0267727 A1 | 10/2009 | Ashikaga | |

OTHER PUBLICATIONS

Bryant, J., et al., "Data Converter Architectures," Analog-Digital Conversion, Chapter 3, Section 3.1: DAC Architectures, pp. 3.1-3.38.
O'Dwyer, T.G., et al., "An Enhanced Model for Thin Film Resistor Matching," *IEEE*, pp. 45-49 (2009).
Tian, W., et al., "Mismatch Characterization of a High Precision Resistor Array Test Structure," *IEEE* Conference on Microelectronic Test Structures, pp. 1-6 (Mar. 24-27, 2008).

* cited by examiner

*Primary Examiner* — Khai M Nguyen
(74) *Attorney, Agent, or Firm* — Hamilton, Brook, Smith & Reynolds, P.C.

(57) ABSTRACT

A resistor string digital to analog converter formed of polysilicon resistor segments to each of which is applied an electric field. The approach improves the overall accuracy.

21 Claims, 8 Drawing Sheets

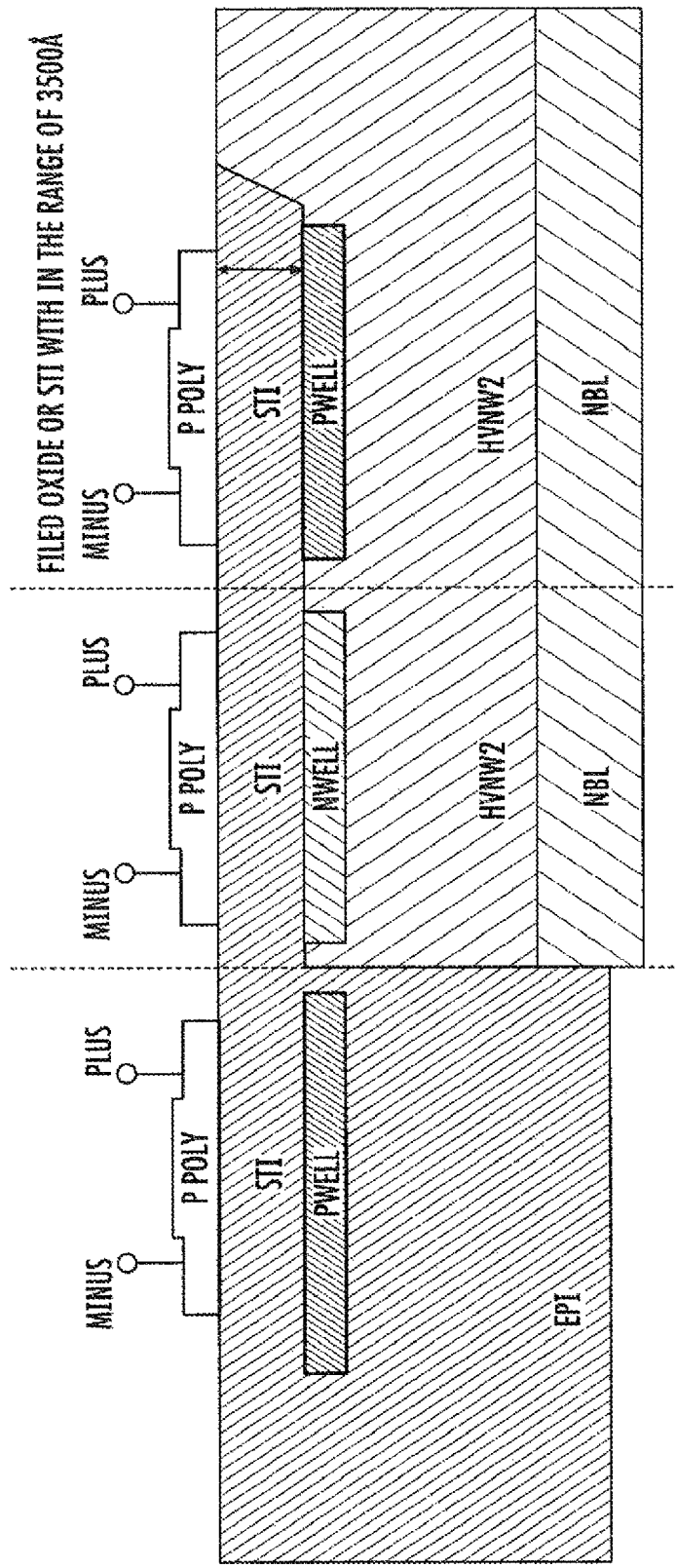

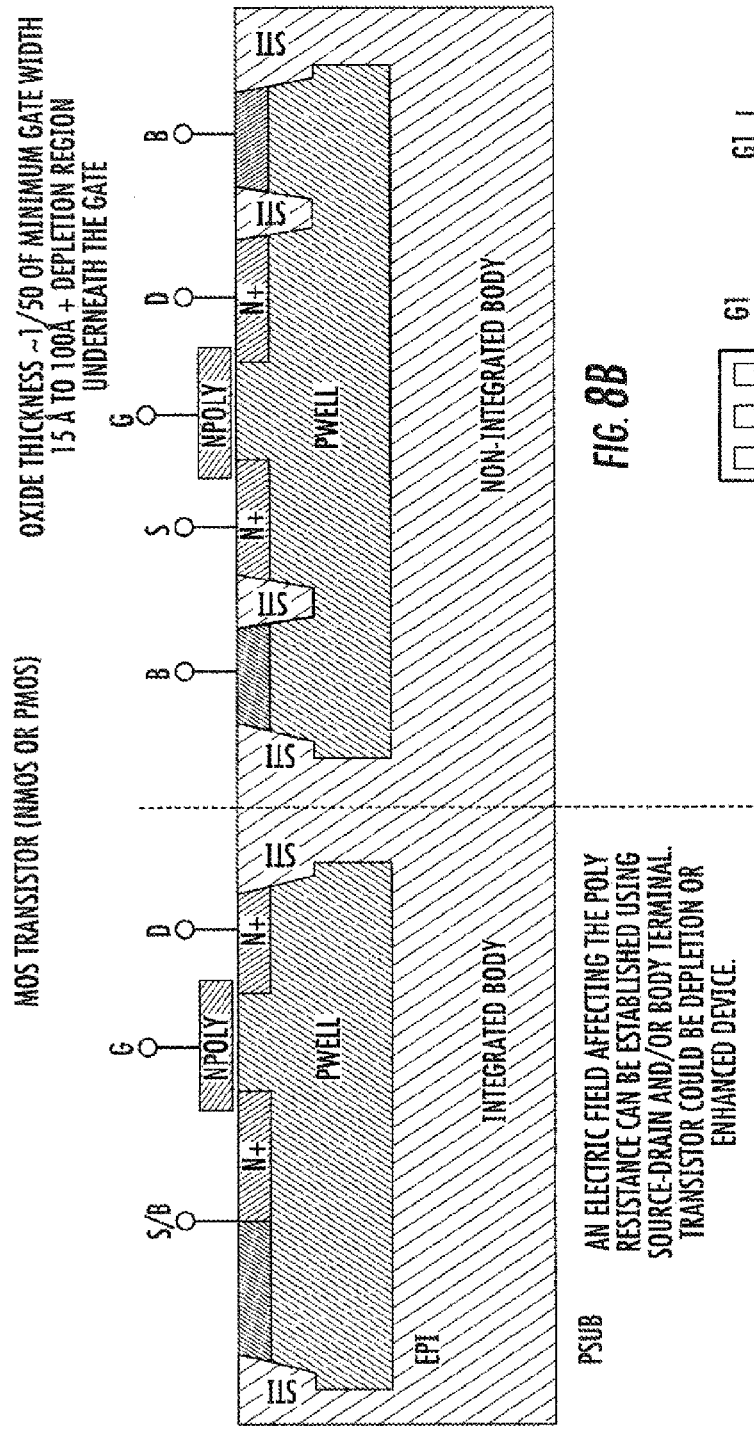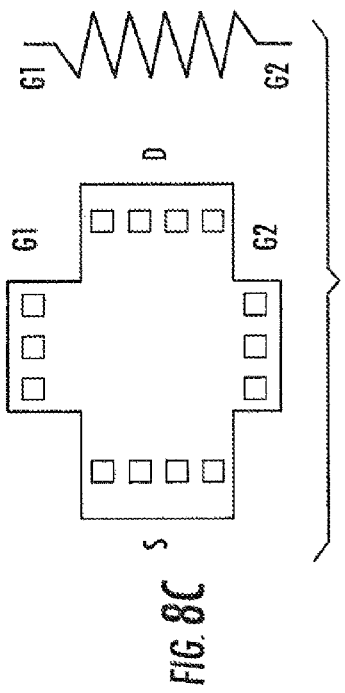
FIG. 8A
FIG. 8B
FIG. 8C

FINE RESISTANCE ADJUSTMENT FOR POLYSILICON

CROSS REFERENCE TO RELATED APPLICATIONS

This application claims the benefit of U.S. Provisional Application No. 61/172,318, filed on Apr. 24, 2009 and claims priority to copending U.S. patent application Ser. No. 12/713,841 filed Feb. 26, 2010 by Motamed, A., entitled "Unbuffered Segmented R-DAC with Switch Current Reduction". The entire teachings of the above applications are incorporated herein by reference.

BACKGROUND OF THE INVENTION

Many circuits demand well matched resistors. However, due to process limitations, the attainable matching is often limited. Examples of circuits needing very good matching include but are not limited to Analog to Digital Converters (DAC) and Digital to Analog Converters (ADC). A DAC is a circuit that takes a number of digital bits as input and produces a corresponding analog output. One approach to DAC design is a resistor-string or R-DAC. That circuit topology arranges a number of resistors, or other resistive circuit elements, in series between a high and low reference voltage. An array of switches is controlled by the digital input bits. The switches determine the connection between the resistors, and hence determine the output voltage. The number of resistors depends on the desired resolution—in the simplest conceptual approach for a 16-bit converter, for example, $2^{16}-1$ or 65,535 resistors are typically needed to provide all possible output levels.

Other approaches to DAC design achieve the same end using a fewer number of resistors. For example, a so-called segmented R-DAC reduces the total number of required resistances by using two or more resistor string segments arranged, at least in part, in parallel. The first segment, controlled by the most significant input bits, provides a course output approximation. The second and subsequent segments are controlled by lesser significant bits and provide finer selection of the output.

Resistor string DACs are a suitable architecture when monotonicity is a major concern. However, this architecture is not practical for high resolution DACs, as the number of resistive elements increases exponentially with the desired resolution. Consequently, segmented R-DAC architectures often strike a good compromise between monotonicity and complexity for higher resolution DACs.

Another approach to providing increased resolution with a decreased number of resistances is the R2R architecture. The R2R architecture principally consists of a repetitive array of resistor arranged in a ladder-like configuration. In an R2R ladder implementation, the resistors in the ladder include a reference resistance value, R, and a resistance value twice that amount, 2R. The R and 2R resistances cause input bits to be weighted in their contribution to the output voltage. This architecture can also achieve high accuracy and low response time. But since R2R ladders also typically require an external buffer to provide low impedance connections, they are less than ideal in certain applications.

SUMMARY OF THE INVENTION

In selected embodiments a mechanism is provided to provide fine adjustment of resistive circuit elements, such as but not limited to resistors, in a precision circuit such as a Digital to Analog Converter (DAC). The resistance value of each resistive circuit element is influenced by applying one or more electric fields to adjust a voltage coefficient. The electric field may be applied to a resistive element at, along or within a top portion, bottom portion, to both a top and bottom portion, or in other ways.

In one example embodiment, each resistive element in a resistor string is sandwiched by a diffusion well placed underneath and metal plate placed on top. Control voltages are applied to the top metal plates and a different set of control voltages are applied to the bottom diffusion wells. The control voltages are used to adjust a voltage coefficient of each of the resistive elements independently, thereby precisely controlling their individual resistances.

The control voltages can be set at an optimum value during a test calibration procedure that measures one or more responses of the circuit to determine actual resistance values of the resistors and compares them to an ideal resistance. In one implementation, digital representations of the control voltages are stored in some form of non-volatile memory on the same chip as the R-DAC. An auxiliary DAC in connection with a switch matrix converts the stored digital values to analog voltages and applies the voltages to the diffusion wells and the metal plates of each resistive element.

In another implementation, the control voltages can be determined dynamically, during circuit operation. That approach can be used to provide fine control over the resistances in response to changes in ambient operation conditions, such as temperature. The auxiliary DAC can be a low resolution DAC and have low accuracy requirements. This is because any inaccuracy of the auxiliary DAC can be accounted for during the calibration procedure.

In preferred embodiments, such as in a multiple segment R-DAC, the voltage coefficient calibration scheme need only be implemented for the first segment. It is this first segment of the DAC that requires the highest precision resistances and is most susceptible to inaccuracy.

It is also possible to provide for fine adjustment of the resistive components in other ways so long as the circuit layer that is used for the resistance has a usable and adjustable voltage coefficient.

A polysilicon resistor can serve as the resistive element in one embodiment.

However, a MOS transistor can also be used to provide the resistive element. In this embodiment, a field oxide and/or Shallow Trench Isolation (STI) area can be used to provide a depletion region underneath an MOS gate structure. In one approach, a field oxide layer is placed over an NMOS type structure formed inside a N-well. In this implementation, the NMOS structure becomes a depletion mode device that provides a channel of charge underneath a gate oxide area, thus effectively acting as a conductive plate connecting a source and drain terminal. If the source and drain terminal are shorted together, a voltage applied to with respect to gate terminal will appear on the channel across the gate (serving as the resistive element) oxide and allow for modulation of the resistance. Alternatively, Polysilicon gates of an NMOS transistor in P-well or a PMOS in N-well can be used as a resistor element with the body connection serving as control terminal for modulating the gate resistance. The transistor gate can be either salicided or non-salicided and both are in the scope of this invention.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 7A, 7B and 7C illustrate various types of structures that can be used to provide the resistive elements.

FIGS. 8A, 8B and 8C illustrate two different resistive MOS transistor structures in more detail.

DETAILED DESCRIPTION OF A PREFERRED EMBODIMENT

Figure 1:
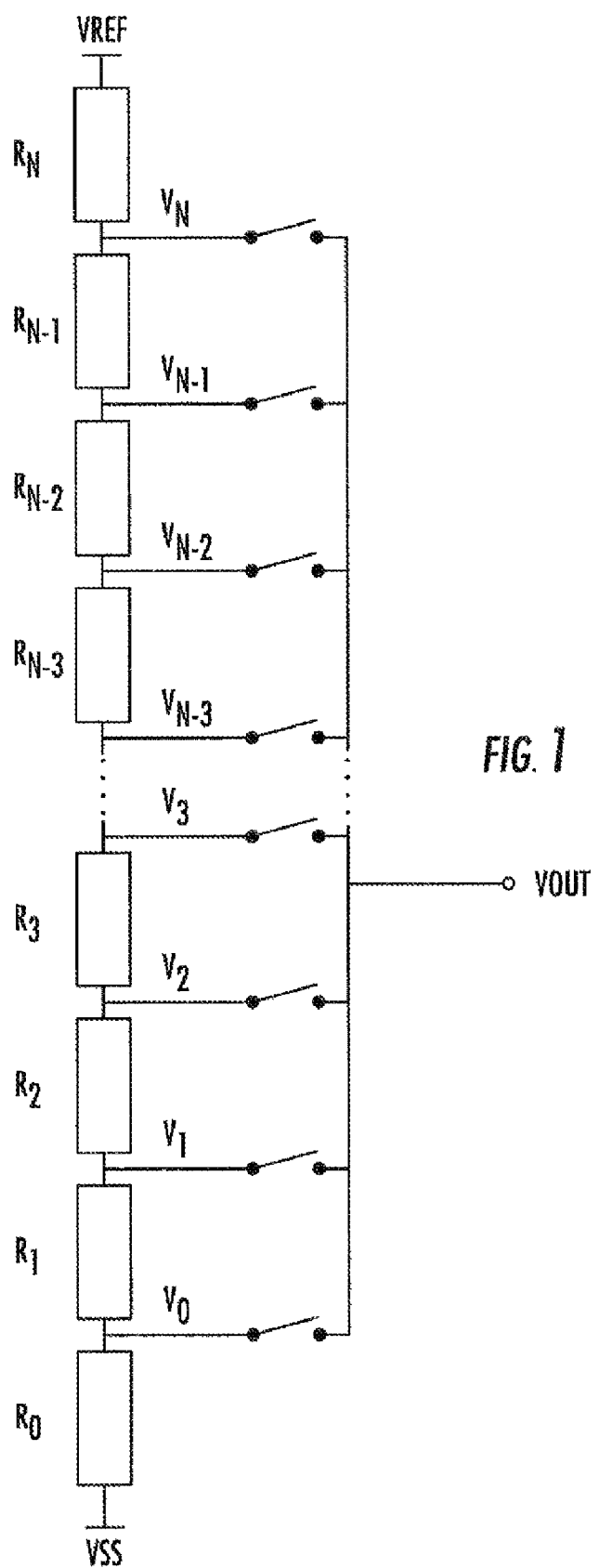
FIG. 1 is a simple R-string DAC.

FIG. 1 shows a simple R-string DAC architecture. In the shown implementation a number, N+1, of resistive circuit elements $R_o, \ldots, R_N$ are placed in series. A set of structures provide N output voltage stops at nodes $V_o, \ldots, V_{N-1}$. The maximum achievable resolution is determined by the number of resistive elements in the string. However, the relative accuracy is limited by the maximum attainable accuracy in each of the resistances. The apparatus and methods described herein are used to allow for precision adjustments to the resistance values of each element. These adjustments can be determined during manufacture, at test phase, or in operation of the R-DAC in the field.

More particularly, it is not possible in practice to ensure that the resistance values of every resistive element $R_o, \ldots, R_N$ are exactly equal. Random resistive component mismatching as caused by semiconductor process imperfections is unavoidable. However, polysilicon and diffusion type resistors exhibit a non-zero voltage coefficient. That is, their resistance can be influenced and modulated by applying an electric field. As explained herein, this phenomenon can be used to improve the overall accuracy of a DAC.

Figure 2:
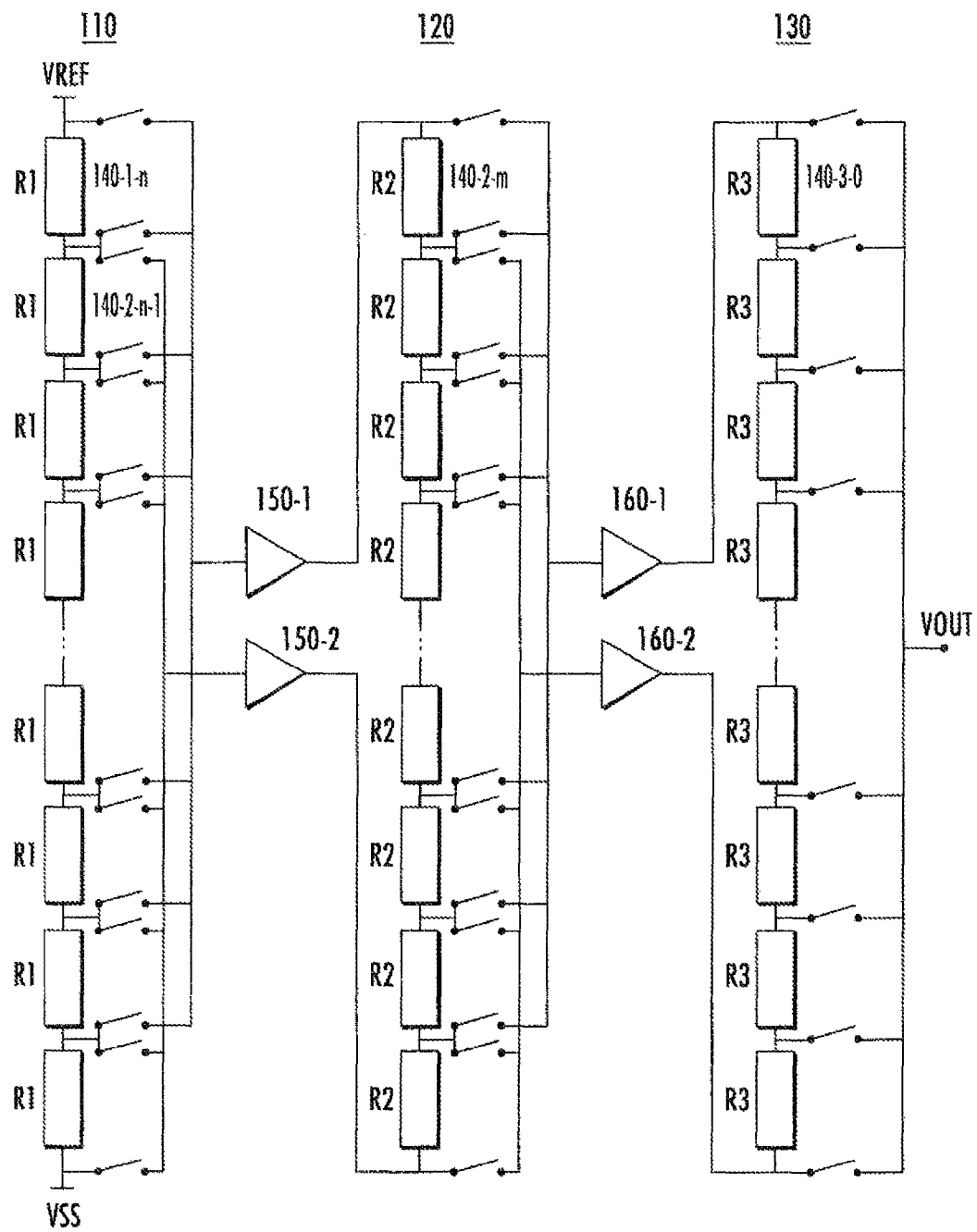
FIG. 2 is an example segmented R-DAC that uses buffers between the segments.

A three-segment buffered R-DAC 100 is shown in FIG. 2. This architecture can be readily generalized to more than three segments. The rectangles represent resistance "sub-segments" 140-1-n, 140-2-n-1, 140-2-m, 140-3-0, etc., which may each in fact consist of multiple physical resistors. The first segment 110 is represented by the resistances in the left hand column. The second segment 120 is the resistances in the right hand column. Note that the resistances R1, R2, R3, etc., may differ in each segment. The output of the DAC shown in FIG. 2 spans the range of VSS to VREF. The segments are isolated by two voltage buffers, 150-1, 150-2, 160-1, 160-2. These voltage buffers increase power consumption and can become a noise source.

Figure 3:
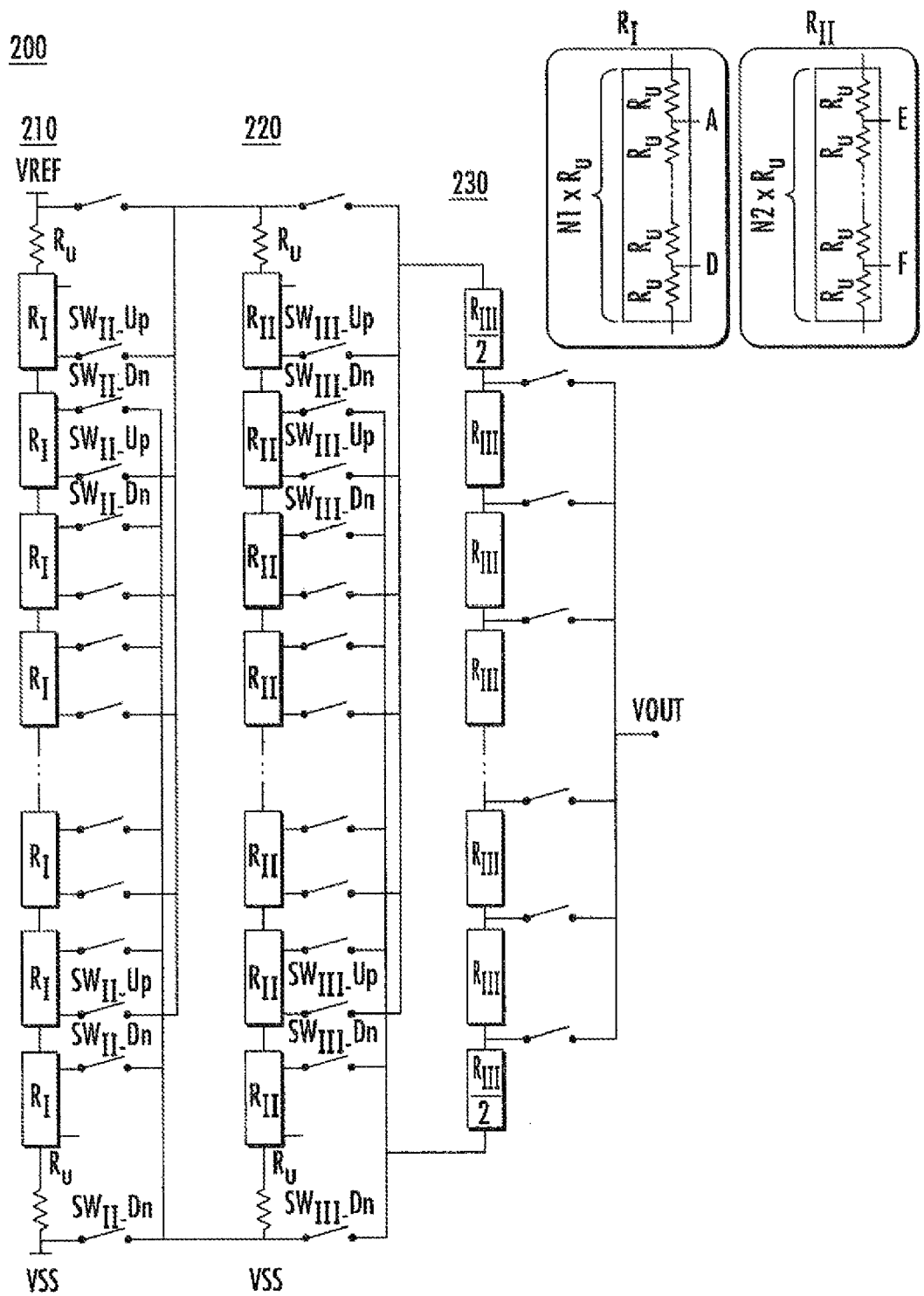
FIG. 3 is an example of an unbuffered segmented R-DAC.

As such the un-buffered DAC 200 architecture shown in FIG. 3 is preferred in certain applications. This figure shows a DAC with three segments 210, 220, 230. Similar to the FIG. 2 buffered version, it can be generalized to any number of segments. Here the first 210, second 220 and third 230 segments each resolve m1, m2 and m3 bits respectively. The DAC therefore has an overall resolution of N=m1+m2+m3 bits. More detail of the sub-segments is shown to the upper right in this drawing. For example, each of the first segment's $2^{m1}$ sub-segments 240-1 is comprised of N1 unit resistors R (to provide the total sub-segment resistance $R_I$), and each of the second segment's $2^{m2}$ sub-segments 2 is comprised of N2 unit resistors R (to provide total sub-segment resistance $R_{II}$.

In order to compensate for the voltage drop caused by the loading of the second segment 220, the connection taps are connected to one or more unit resistors, R immediately above the top, and one or more unit resistors, R immediately below the bottom, of the chosen sub-segment. Switches $SW_{II}1Up$ and $SW_{II}1Dn$ connect the first segment to the second segment. A similar arrangement is implemented for connection of the second segment to the third segment via switchless $SW_{III}U_p$ and $SW_{III}D_n$.

Note, the third segment 230 of the DAC is implemented as a series connection of two $R_{III}/2$ unit resistors and $2^{m3}-1$ sub-segments, each comprised of N3 unit resistors $R_{III}$ (for a total subsegment 230 resistance $2^{m3}R_3$).

Note that not all of the inter-segment switches are shown for the sake of clarity. For example, the total number of taps (switches) from the first segment is $2^{(m1+1)}+2$. Different arrangements for the third segment are equally valid. For example, connection of $2^{2m3}-1$ elements each comprised of N3 unit resistors in series with N3 unit resistors on top can span the range of VSS to VREF-LSB. Similarly, connection of $2^{m3}-1$ elements each comprised of N3 unit resistors in series with N3 unit resistors at the bottom spans the range of VSS+VLSB to VREF. The number of sub-segments m1, m2, m3 and the number of unit resistors per sub-segment N1, N2, N3 can be set to minimize a desired error function.

More details of this type of unbuffered, segmented R-DAC are provided in a copending U.S. patent application Ser. No. 12/713,841 filed Feb. 26, 2010 by Motamed, A., entitled "Unbuffered Segmented R-DAC with Switch Current Reduction", which is hereby incorporated by reference in its entirety.

Figure 4:
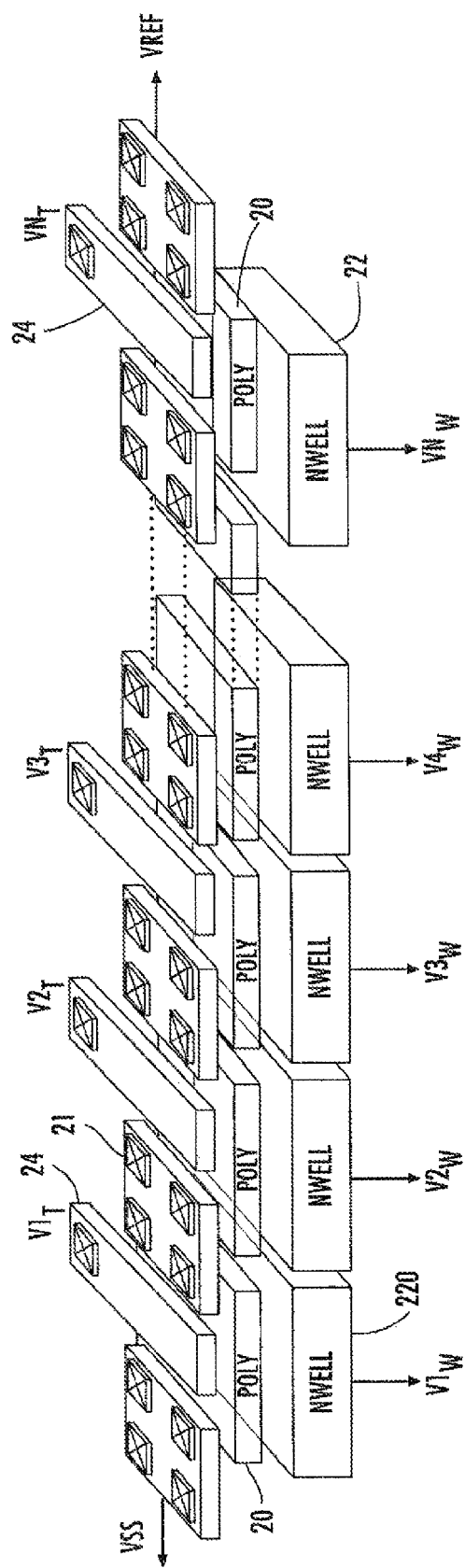
FIG. 4 is an example of a sub-segment section constructed with polysilicon resistors connected in series. Each resistive element has a diffusion well underneath and a metal plate on top to provide control over the resistance.

FIG. 4 shows more detail of the construction of a resistive element string 10 or sub-segment which can be used in a string R-DAC of FIG. 1, a segmented R-DAC of FIG. 2, an un-buffered segmented R-DAC of FIG. 3, an R2R array, or other resistive arrays. In this embodiment, each resistive element in the string 10 is provided by a polysilicon resistor 20. Each resistor 20 is sandwiched by a diffusion well 22 underneath and/or a metal plate 24 on top. A typical implementation may use both a bottom diffusion well 22 and top metal plate 24 to control the resistance of each polysilicon resistor 20. Other metal plates 21 provide a connecting path for switches (not shown) between each resistor 20, as needed.

Voltages $V1_T$ through $VN_T$ are applied to the N top metal plates 24 and voltages $V1_W$ through $VN_W$ are applied to the N bottom diffusion wells 22. Each of these voltages is set to an optimal value prior to or during circuit operation. For example during a manufacturing test procedure these voltages can be determined and then stored in some form of permanent non-volatile memory. In other embodiments, these voltages can also be determined as part of a power on or background calibration process and stored in volatile memory. Preferably these voltages are stored on the same chip as the resistor string 10. Depending on the resistor 20 voltage coefficients, these stored voltages can either completely or partially compensate and remove random mismatching between resistors 20.

The voltages $V1_T$ through $VN_T$ and $V1_W$ through $VN_W$ can either be stored in the form of charge in a Floating Gate MOS technology (FGMOS) circuit or in the form of digital numbers in a non-volatile memory such as EEPROM or fuses or some other non-volatile or volatile memory. In the later implementation, as explained in more detail below, an auxiliary DAC can be used to convert these stored digital numbers to an analog voltage.

Although what is shown in FIG. 4 is an arrangement where an N well is located beneath a polysilicon resistive region 20 and top metal plate 24, a similar result can also be achieved with other resistive structures. For example, in a process where two polysilicon layers are available, an N-well or P-well can have both a first and second poly layer formed on top. The first poly layer (i.e., the layer sandwiched between the other two) is used as the resistance layer and the adjustment voltages are applied to the well and the second poly layer.

In another arrangement again using a two polysilicon layer process, a structure consists of a first poly layer, a second poly layer and a first metal layer. The second poly layer serves as the resistance element and the adjustment voltages are applied to the first poly layer and the metal layer.

In general, therefore, any sandwich or open face structure can work as long as the layer in the middle is used for the resistance and that the layer exhibits a usable voltage coefficient over a range of suitable applied voltages.

Figure 5:
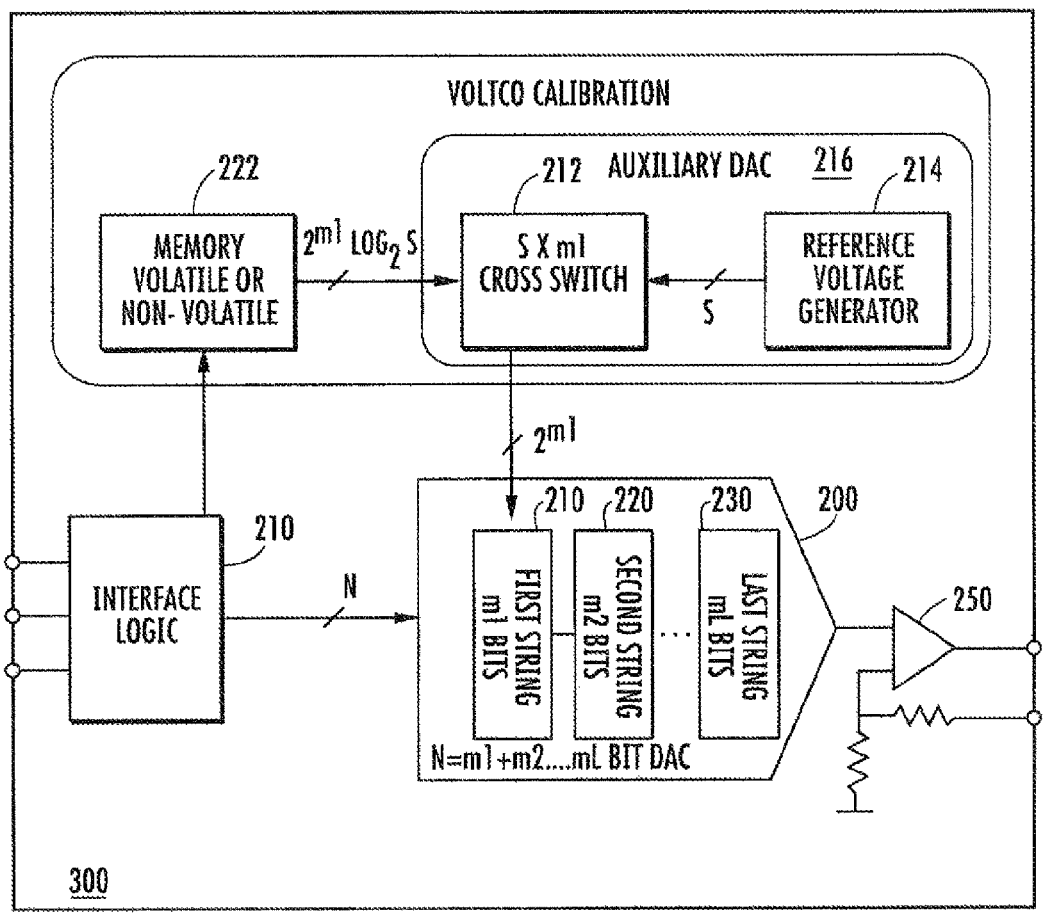
FIG. 5 is a block diagram of a segmented R-DAC showing an auxiliary DAC that includes a reference voltage generator and crosspoint switch to apply the reference voltages as read from a non-volatile memory.

FIG. 5 is one example of using an auxiliary DAC to provide the stored analog control voltages. Here, the completed digital to analog converter 300 consists of a segmented R-DAC 200 (such as that is shown in FIG. 3) and an associated output buffer circuit 250. Interface logic accepts the digital input bits and provides N of these bits to be converted by the segmented R-DAC 200. Other input bits are provided for the test mode to access the memory 200 for programming the stored bits. The memory 220 provides inputs to the auxiliary DAC 210. The auxiliary DAC includes both an S by $2^{m1}$ cross switch 212 and a voltage generator 214. The auxiliary DAC 210 provides inputs to the $2^{m1}$ resistive elements of the first segment 210.

Figure 6:
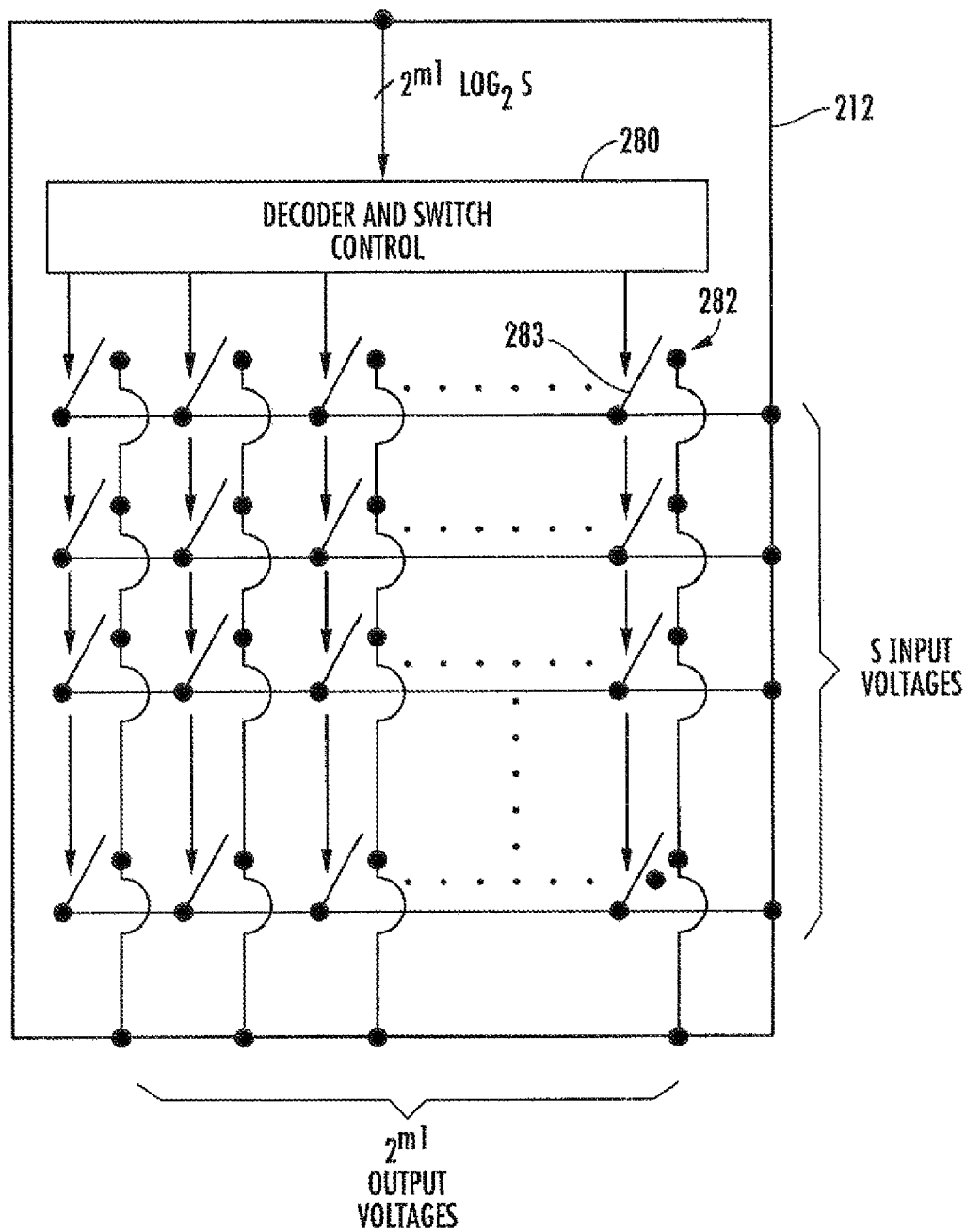
FIG. 6 is a more detailed view of the crosspoint switch FIG. 6.

As shown more particularly in FIG. 6, the cross switch 212 accepts S input voltages from the reference voltage generator 214 and provides $2^{m1}$ output voltages at a decoder and switch control circuit 280. In a preferred embodiment, the S input voltages drive an array 282 of switches 283. The settings of the various switches 283 are controlled by the $2^{m1} \log_2 S$ input bits provided from the memory 222.

The circuits shown on FIGS. 5 and 6 can thus provide a single voltage to each of the $2_{m1}$ resistive elements in the first string 210. This circuit is duplicated if the design applies control voltages to both the top plate 24 and diffusion well 22 for example.

In operation, the DAC 200 is shown as a segmented R-DAC, although that is not a requirement. The first segment is composed of $2^{m1}$ resistors and receives m1 input bits. The second segment is comprised of $2^{m2}$ resistors and resolves m2 bits and so on. In a preferred embodiment for a segmented R-DAC, stored adjustment voltages are applied to fine tune the resistors of only the first segment 210. The reference voltage generator 214 produces S distinct voltage levels. The cross switch matrix 212 selects and routes an appropriate one of the S voltage levels to each of the resistors of the first segment 210. It will be understood that alternate implementations are possible for the switch matrix 212.

In one implementation, the appropriate control voltages are determined during a calibration mode. This calibration mode can be either enabled during a manufacturing test procedure for the chip or can also be performed on demand in the field. In either case, the results of the test are stored in the on chip memory 222. A final test calibration approach requires that the memory 220 be non-volatile.

However a volatile memory can be used when the calibration operation is performed in the field on demand. When the test process is performed on demand, such as in a background mode in the field, fine adjustments in the resistances can be made responsive to ambient conditions. For example, the calibration process can be made responsive to changes in temperature (such as via a thermistor reference or in other ways) as the ambient operating temperature changes.

Examples of other resistive circuit element structures that provide an equivalent end result as the polysilicon structures of FIG. 4 are shown in FIGS. 7A, 7B and 7C. In the embodiment of FIG. 7A a P-well is formed in an epitaxial base layer. A field oxide or Shallow Trench Isolation (STI) layer is then formed on top of the P-well, a P type polysilicon layer is then formed on a top surface. In this approach, the P-poly layer to substrate voltage controls a thin depletion region underneath the Polysilicon. This depletion modulates the effective electrical thickness of the Polysilicon resistor.

Other structures that can achieve the same result are shown in FIGS. 7B and 7C which N-type Buried Layer (MBL), High Voltage N-Well (2), and an N-well or P-well, respectively.

FIGS. 8A, 8B and 8C are examples of another implementation using MOS transistor structures. FIG. 8A is an example of an NMOS structure with FIG. 8B being an example PMOS structure.

Each of these implementations generates an electric field to control a resistance, which is established using a source a drain and/or body terminal structure. The MOS transistor can be implemented as a depletion mode or enhanced mode device.

In the case of FIG. 8A an epitaxial layer provides an integrated body in which are formed a P-well surrounded by top STI, P+, and N+ regions forming respective source/body and drain terminals. An N-poly layer formed on top serves as a gate. In this case, the NMOS device becomes a depletion mode device. In other words, there exists a channel of charge underneath the gate oxide which effectively acts as a conductive plate to connect the source/base terminal and the drain terminal. When the source and drain are shorted together, a voltage applied to them will then appear on the channel formed under the gate, and to thereby modulate its resistance.

FIG. 8B is a similar NMOS structure. A thin oxide thickness layer of approximately 1/50 of a minimum gate with (in a range of 15 angstroms) results in a depletion region underneath the gate. Here a non-integrated body structure requires STI defined islands of P+ and N+ regions to form the bulk, source, drain terminals. The gate terminal is formed similar to the implementation of FIG. 8A.

FIG. 8C is a top level view of the structure of FIGS. 8A and 8B.

As mentioned above, first segment resistor matching is the most critical and is predominantly sensitive to low voltage input fluctuations. Therefore, in a preferred embodiment of a multi-segment R-DAC, it is necessary only to precisely control the resistance of the elements of the first segment. In addition, unit resistors with the same nominal resistive value but different physical area can also be used for different segments in a multi-segment R-DAC. This can further optimize linearity versus die-area tradeoff. Better linearity, better matching and consequently larger die-area normally provides more accurate resistance. However, in order to improve linearity without excessive increase in die-area, the fine resistance calibration scheme via control over voltage coefficients can be used as described herein. The resistance of each sub-segment can thus also be influenced and modulated by applying an electric field to various resistor structures, to improve resistive element accuracy in a smaller physical space than would otherwise be required.

Using the coefficient calibration scheme described herein INL level has been achieved with relaxed unit resistor matching of about 0.09%. To achieve an equivalent improvement without voltage calibration, one would have to increase the area of the resistors by a factor of more than two. Since resistor voltage coefficient is a weak effect, the voltage coefficient calibration method explained herein is an efficient technique only if initial resistor matching is better than 14 or 15 bit levels.

The stored voltages for $V1_T$ through $VN_T$ and $V1_W$ through $VN_W$ can be determined in a test process. During the test process the digital inputs can be ramped from an all zero condition to an all one condition. The resulting analog output voltage can then be measured. In a perfect R-DAC—in which all of the resistors were already equal—the resulting ramp would be perfectly linear. The deviations from an ideal linear characteristic i.e., an INL curve, can then be obtained by subtracting the measured result from the ideal expected results. This deviation is then used to determine voltage values to be applied to each of the metal and diffusion well portions of the resistor string.

With the architecture described above it is also possible to correct for other type of resistor string errors. For example, even in the absence of resistor errors and where all resistors are perfect, corrections of other phenomena can be provided. In particular, the resistance of polysilicon implemented resistors is known to depend on a voltage coefficient that is a function of the difference between the polysilicon voltage and the substrate voltage. A typical voltage coefficient may be 0.05% indicating that when the poly to substrate voltage is increased by one volt the resistance will change by 0.05%. The architecture described above can also correct for these changes in voltage coefficient. Within the resistor string, resistors at the bottom of the string typically experience a much lower voltage difference to the substrate than resistors at the top of the string. For example, the resistor at the top of the string of FIG. 1 deviate more from its nominal value than $R_0$ does. This is because the voltage coefficients, which is the rate of change, are equal for both resistors but the voltage that these coefficients get multiplied by are different.

It should be understood that alternate embodiments also fall within the scope of this technique. Thus, rather than applying bottom diffusion 22 wells and metal plates 24 to each poly segment 20, it is also possible to adjust each segment by creating electric fields in other ways. For example, a second poly segment can be disposed along the sides of each individual poly segment 20 (not shown in FIG. 4). A voltage can then be applied to that second poly segment to create an electric field and thereby produce a change in the individual resistances.

What is claimed is:

1. A digital to analog converter apparatus comprising:
a plurality of resistive elements connected in a string;
a plurality of electric field applicator circuits, each coupled to a corresponding one of the resistive elements, so that at least two resistive elements have an electric field applicator circuit coupled thereto, the electric field application circuits generating an electric field in response to a corresponding control voltage to adjust a voltage coefficient, and as a result, for adjusting a resistance of the respective coupled resistive element;
a control voltage generator, for applying the control voltages to the plurality of electric field applicator circuits, such that each control voltage is independent of the others, wherein the control voltage generator further comprises:
a memory, for storing digital information representing the control voltages; and
an auxiliary digital to analog converter, coupled to receive the digital information from the memory, and to generate the control voltages for each of the respective voltage sources.

2. The apparatus of claim 1 wherein the resistive elements each comprise a polysilicon resistor segment and the electric field applicator circuits comprise:
a diffusion well disposed below each one of the plurality of polysilicon resistor segments; and
a metal region disposed above each one of the polysilicon resistor segments.

3. The apparatus of claim 2 wherein the diffusion well is either an N-well or P-well.

4. The apparatus of claim 1 wherein the resistive elements each comprise a polysilicon resistor segment and the electric field applicator circuits comprise:
a second polysilicon segment disposed below each one of the plurality of polysilicon resistor segments; and
a metal region disposed above each one of the polysilicon resistor segments.

5. The apparatus of claim 1 wherein the resistive elements each comprise a polysilicon resistor segment and the electric field applicator circuits comprise:
a diffusion well disposed below each one of the plurality of polysilicon resistor segments; and
a second set of polysilicon segments disposed above each one of the polysilicon resistor segments.

6. The apparatus of claim 5 wherein the diffusion well is either an N-well or P-well.

7. The apparatus of claim 1 wherein the digital to analog converter is a resistor string, segmented buffered R-DAC, segmented unbuffered R-DAC or R2R DAC.

8. The apparatus of claim 1 wherein the digital to analog converter is a segmented R-DAC and the resistive elements of only a first segment are coupled to electric field applicator circuits for adjusting resistance thereof.

9. The apparatus of claim 1 wherein the resistive element further comprises portions of a Metal Oxide Semiconductor (MOS) transistor.

10. The apparatus of claim 9 wherein the resistive element further comprises:
at least one of a field oxide and/or Shallow Trench Isolation (STI) area to form a depletion region underneath a gate of the MOS transistor.

11. The apparatus of claim 9 wherein the resistive element further comprises:
a field oxide layer placed over an NMOS type transistor formed inside a P-well.

12. The apparatus of claim 9 wherein the resistive element further comprises:
a field oxide layer placed over a PMOS type transistor.

13. The apparatus of claim 1 additionally comprising:
control circuitry to determine the digital information representing the control voltages during a manufacturing test procedure.

14. The apparatus of claim 1 additionally comprising:
control circuitry to determine the digital information representing the control voltages during operation of the digital to analog converter.

15. A method for operating a digital to analog converter apparatus comprising:

applying a plurality of electric fields to a corresponding one of a plurality of resistive elements, so that at least two resistive elements have an electric field applied thereto;

generating the electric fields in response to a corresponding control voltage to independently adjust a voltage coefficient of each of the resistive elements;

storing information in a memory representing the control voltages; and converting the information stored in the memory to analog voltages from which are derived the control voltages.

16. The method of claim 15 wherein the step of storing information is performed during a manufacturing test procedure and the memory is a non-volatile memory.

17. The method of claim 15 wherein the step of storing information is performed during field operation of the digital to analog converter and the memory is a volatile memory.

18. The method of claim 15 wherein the step of storing information is performed during field operation of the digital to analog converter and the memory is a non-volatile memory.

19. The method of claim 15 wherein the step of converting the stored information to a control voltage further comprises:

selecting control voltages via a switch matrix.

20. The method of claim 15 wherein the step of converting the stored information comprises:

adjusting the control voltages according to ambient temperature.

21. The method of claim 15 wherein the digital to analog converter is a segmented R-DAC and only the resistive elements of a first segment are subjected to the step of applying a plurality of electric fields.

* * * * *